(12) United States Patent
Maloney et al.

(10) Patent No.: US 8,026,736 B2
(45) Date of Patent: Sep. 27, 2011

(54) WATER-LEVEL CHARGED DEVICE MODEL FOR ELECTROSTATIC DISCHARGE TEST METHODS, AND APPARATUS USING SAME

(75) Inventors: Timothy J. Maloney, Palo Alto, CA (US); Bruce Chou, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 12/319,105

(22) Filed: Dec. 30, 2008

(65) Prior Publication Data

US 2010/0165537 A1 Jul. 1, 2010

(51) Int. Cl.
*G01R 31/26* (2006.01)
*G01R 31/20* (2006.01)

(52) U.S. Cl. .......... 324/762.01; 324/754.01; 324/754.21

(58) Field of Classification Search ................ None
See application file for complete search history.

(56) References Cited

U.S. PATENT DOCUMENTS

| | | | | | |
|---|---|---|---|---|---|
| 4,926,285 | A | * | 5/1990 | Reinhardt et al. | 361/230 |
| 5,519,327 | A | * | 5/1996 | Consiglio | 324/678 |
| 5,675,260 | A | * | 10/1997 | Consiglio | 324/763 |
| 5,818,235 | A | * | 10/1998 | Simonov et al. | 324/457 |
| 7,138,804 | B2 | * | 11/2006 | Ker et al. | 324/452 |

* cited by examiner

*Primary Examiner* — Vinh Nguyen
(74) *Attorney, Agent, or Firm* — John N. Greaves

(57) ABSTRACT

A charged device model (CDM) electrostatic discharge (ESD) testing is carried out at wafer level. Wafer CDM pulses are repeatedly applied and monitored. The wafer CDM (WCDM) pulses are accomplished with a probe-mounted printed-circuit board and a high-frequency transformer that captures fast CDM pulses. Modeling of CDM and WCDM in the time and frequency domain illustrates the dominant effects, and shows that WCDM can reproduce all the major phenomena of package-level CDM testing.

9 Claims, 10 Drawing Sheets

US 8,026,736 B2

WATER-LEVEL CHARGED DEVICE MODEL FOR ELECTROSTATIC DISCHARGE TEST METHODS, AND APPARATUS USING SAME

TECHNICAL FIELD

Disclosed embodiments relate to charged device model electrostatic discharge event apparatus and methods of using them.

BACKGROUND

Charged device model (CDM) electrostatic discharge (ESD) events happen during the mechanical handling of integrated circuits and have often caused device failure. CDM testers have been developed to test the effectiveness of the ESD protection circuitry. CDM testers have also relied upon radio frequency emission evaluation CDM ESD events.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Wafer-level charged device model (WCDM) testing embodiments produce consistent discharge pulses comparable to the waveforms described in CDM industry standards and CDM testers for packaged components according to several embodiments. The WCDM embodiments have proved consistent and reproducible wafer-level testing methods that compare favorably with existing CDM methods, and that show a useful correlation to build confidence in the results. Discharges of an about 15 pico Farad (pF) disk up to 1 kilo Volt (kV) (about 15 nC total charge) were observed. In an embodiment, discharges range from about 4 pF to about 20 pF.

Models of CDM and WCDM in the time and frequency domain have enlightened the understanding of both kinds of tests. CDM testers can have high-frequency resonances traceable to quarter-wave and half-wave effects involving test head and package. Similar WCDM model embodiments show them to be capable of reproducing all features of package-level CDM testing, including rise times, peak currents and high-frequency resonances. The WCDM disk embodiments are also designed with z-matching to give a clean pulse. The WCDM embodiments offer in situ waveform monitoring and useful calibration fixtures, much as does ns-CDM testing.

As a result of several embodiments, safer-level testing can be done before packaging for products, and on a wide assortment of test patterns that can also add to options for evaluating electrostatic discharge (ESD) performance.

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1:
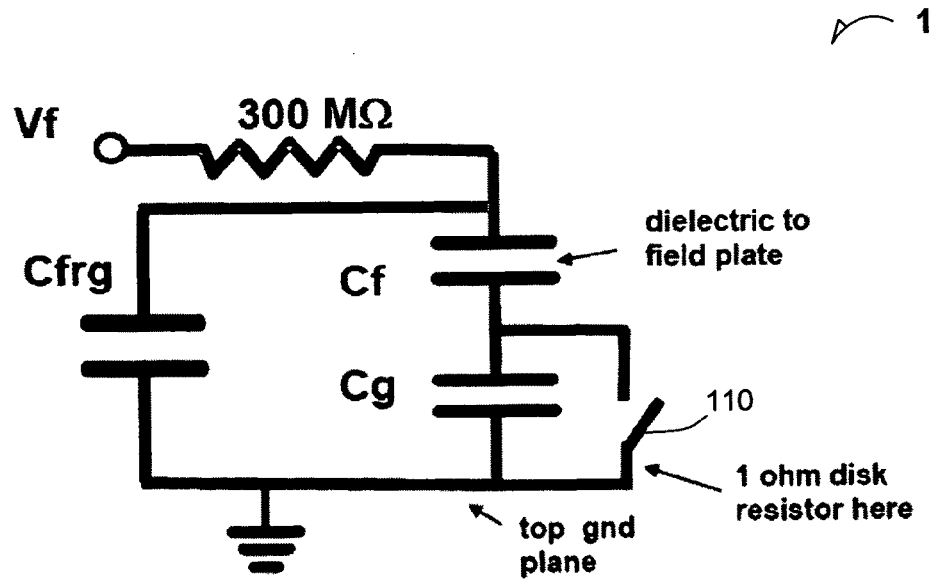
FIG. 1 is a circuit model for a field-induced non-socket charged device model tester according to an example embodiment.

FIG. 1 is a circuit model 100 for a field-induced non-socket charged device model (CDM) tester according to an example embodiment. A nonsocketed CDM (ns-CDM) model simulates actual CDM events. The ns-CDM tester is circuit modeled as in FIG. 1 and the immediate charge packet ($Q_{imm}$) can be calculated. Capacitance from the ground plane to the field plate, Cfrg, is modeled as the capacitance from the ground plane to the field plate. Capacitance of the device under test (DUT), Cf, is the capacitance of the DUT to the field plate. Capacitance of the top ground plane to the DUT. Cg is the capacitance of the top ground plane to the DUT. The switch 110 represents a CDM event when a discharge pin on a CDM apparatus makes contact with the DUT, and consequently, the switch 110 is closed. The resulting $Q_{imm}$ is $$Q_{imm} = Vf\left[\frac{Cf}{Cg+Cf}\right]\left[Cg + \frac{Cf*Cfrg}{Cf+Cfrg}\right] = Q_1 + Q_2. \quad (1)$$

This circuit model has shown close agreement with charge packet measurement done through the 50-ohm (Ω) line that shunts the 1-Ω disk resistor. Equation (1) can be simplified without altering the sum if Cf>>Cg, which implies that Q1<<Q2. It also means the quotient Cf/(Cg+Cf)≈1. The following equation results:

$$Q_{imm} \cong Vf(Cf\|Cfrg). \quad (2)$$

Figure 2:
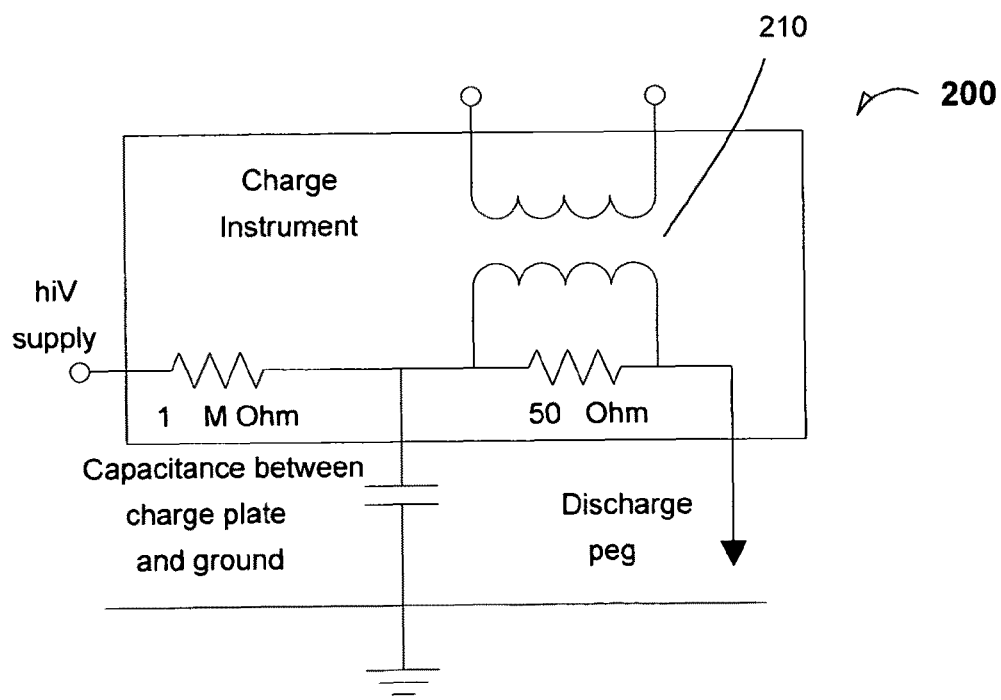
FIG. 2 is a schematic diagram of a charge instrument that was built according to an example embodiment.

FIG. 2 is a schematic diagram 200 of a charge instrument that was built according to an example embodiment. The charge instrument 200 was built on a small PC board. the charge instrument 200 simulates the ns-CDM circuitry and was built to simulate the action of a charged component that touches grounded factory equipment. Equation (3) relates the $Q_{imm}$ of the charge instrument to its equivalent capacitance $C_{eq}$.

$$Q_{imm} = hiV \cdot C_{eq} \quad (3)$$

where V is voltage and $C_{eq}$ is the equivalent capacitance. In an embodiment, the $Q_{imm}$ of the charge instrument is set to be equal a ns-CDM tester through capacitance and voltage.

Figure 3:
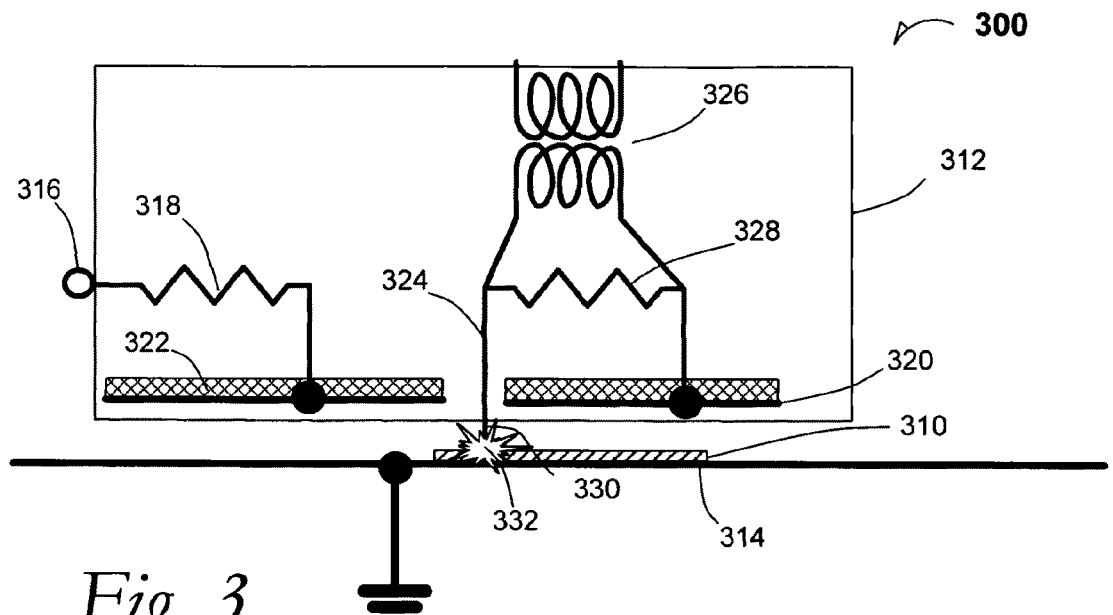
FIG. 3 is a block diagram of an example system for simulating charged device model electrostatic discharge events according to an example embodiment.

FIG. 3 is a block diagram of an example system 300 for simulating charged device model electrostatic discharge events according to an example embodiment. The system 300 includes a discharge device 312 and a ground plane 314. The discharge device 312 includes a voltage source 316 an isolating resistor 318, a charge plate 320, an insulating paddle 322, discharge wire 324, a transformer 326 and a drain resistor 328. The charge plate 320 may also be referred to as a discharge plate 320. A probe tip 330 extends through charge plate 320 and is to make an electrical spark 332 (discharge arc) that affects a semiconductor wafer 310 which is the DUT 310. The probe tip 330 may add several picofarads to the total capacitance being discharged. In an embodiment, the probe tip 330 is The discharge device 312 includes the transformer 328 that is to be connected to an oscilloscope through a conduit such as a coaxial cable. The resistance of the drain resistor 318 may be selected based on impedance in the coaxial cable as well as performance of the transformer 326. In an embodiment, with a 50 ohm (Ω) coaxial cable, the drain resistor 328 is a 5Ω resistor and the turns ratio is 1:1 in the transformer 326. In an embodiment, the value of drain resistor 328 is a z-match to the coaxial cable when the transformer turns ratio is considered.

Figure 4:
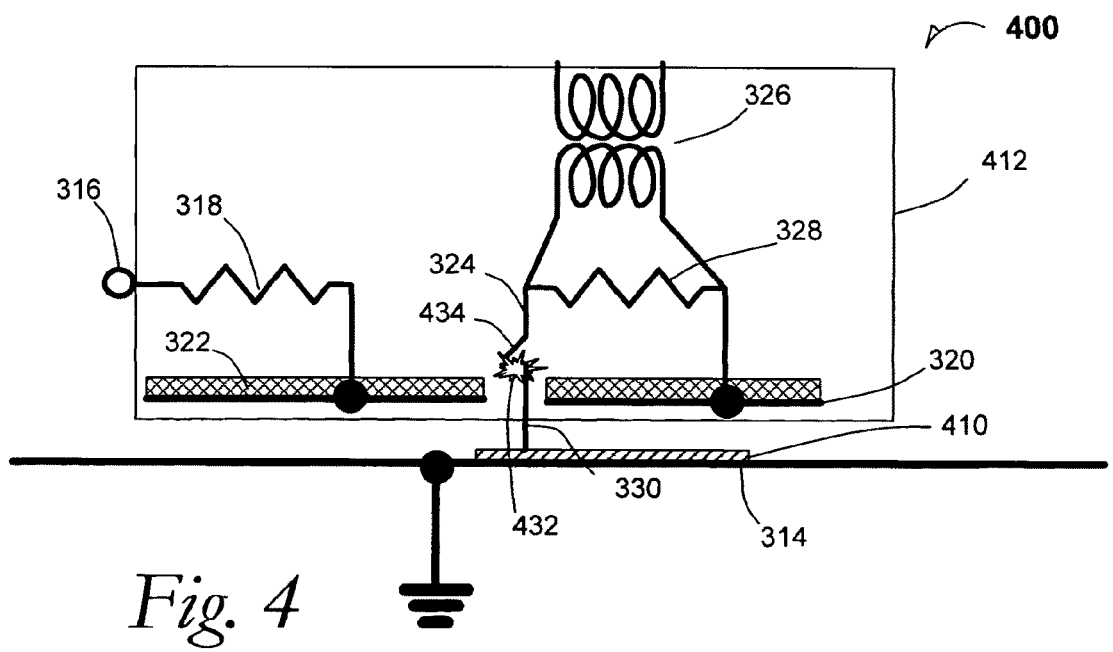
FIG. 4 is a block diagram of an example system for simulating charged device model electrostatic discharge events according to an example embodiment.

FIG. 4 is a block diagram of an example system 400 for simulating charged device model electrostatic discharge events according to an example embodiment. The system 400 includes essentially all the same functionalities as illustrated in the system 300 depicted in FIG. 3. Additionally, a switch 434 has been installed to modify testing. The switch 434 is a relay for discharging the capacitor to the probe tip 330. The discharge arc 432 is located in the relay instead of at a contact pad of the DUT 410. In an embodiment, the switch 434 is a miniature switch such as a mercury arc. By removing the discharge arc 432 from the surface of the DUT 410, pitting or other physical damage phenomena may be localized at the switch 434 and kept away from the DUT 410.

Figures 5, 6:
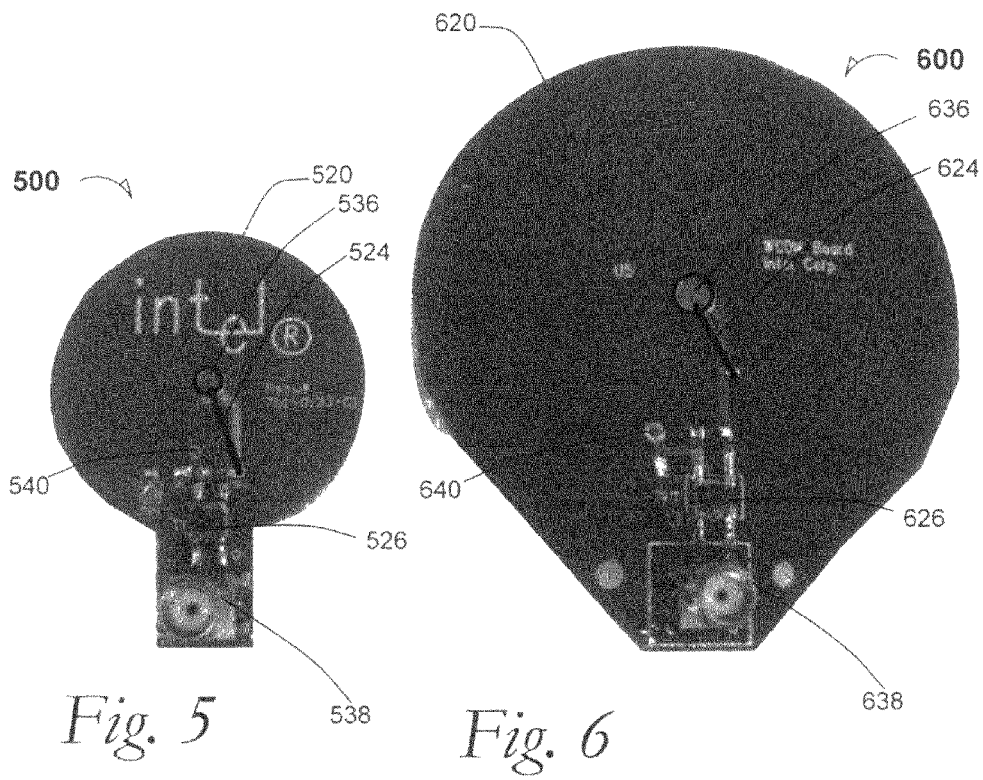
FIG. 5 is a top plan of a charged device model electrostatic discharge apparatus according to an example embodiment.
FIG. 6 is a top plan of a charged device model electrostatic discharge apparatus according to an example embodiment.

FIG. 5 is a top plan of a charged device model electrostatic discharge apparatus 500 according to an example embodiment. The apparatus 500 is a wafer charged device model (WCDM) apparatus 500. The WDCM apparatus 500 includes a charge plate 520 where the reference line from the reference numeral 520 touches the charge plate 520 at the perimeter, but the charge plate itself is obscured in this plan view by solder mask material. The charge plate 520 may also be referred to as a discharge plate 520. The charge plate 520 had a 32 millimeter (mm) diameter. In an embodiment, a viewing hole 536 is located in the charge plate 520 to allow microscopic viewing of the wafer DUT to be located below the charge plate 520.

In an embodiment, no viewing hole is required and a mechanical linkage 538 is used with 3-axis movement that allows the probe tip to touch at test sites on the wafer DUT. This mechanical linkage 538 is a fixture that ties the WCDM apparatus 500 to a positioner such that it is possible to move the charge plate 520 with the probe tip to a desired input/output (I/O) pad on the wafer, which is on the device under test.

In an embodiment, the area of the charge plate 520 is changed or the length of the lead 524 for the probe tip is changed, or both. Based upon the relationship of C≈∈·A/d, capacitance can be adjusted. The WDCM apparatus 500 depicted in FIG. 5 had a capacitance of about 5 pico Farads (pF). As illustrated, the charge plate 520 is in the bottom layer of the WDCM apparatus 500 and it is connected through a charge plate node 540. The probe tip is not seen as it is beneath the charge plate 520, but it can be seen that the discharge wire 524 runs in part as a trace along the upper surface. The probe tip is located at or near the center of the charge plate 520, and the transformer 526 is located at or near the perimeter of the charge plate 520.

FIG. 6 is a top plan of a charged device model electrostatic discharge apparatus 600 according to an example embodiment. The apparatus 600 is a WCDM apparatus 600. The WDCM apparatus 600 includes a charge plate 620 where the reference line from the reference numeral 620 touches the charge plate 620 at the perimeter, but the charge plate itself is obscured in this plan view by solder mask material. The charge plate 620 may also be referred to as a discharge plate 620. The charge plate 620 had a 56 mm diameter. In an embodiment, a viewing hole 636 is located in the charge plate 620 to allow microscopic viewing of the wafer to be located below the charge plate 620.

In an embodiment, no viewing hole is required and a mechanical linkage 638 is used with 3-axis movement that allows the probe tip to touch at test sites on the wafer DUT. This mechanical linkage 638 is a fixture that ties the WCDM apparatus 600 to a positioner such that it is possible to move the charge plate 620 with the probe tip to a desired I/O pad on the wafer, which is on the device under test.

In an embodiment, the area of the charge plate 620 is changed or the length of the lead 624 for the probe tip is changed, or both. Based upon the relationship C≈ε·A/d, capacitance can be adjusted. The WDCM apparatus 600 depicted in FIG. 6 had a capacitance of about 15 pF. As illustrated, the charge plate 620 is in the bottom layer of the WDCM apparatus 600 and it is connected through a charge plate node 640. The probe tip is not seen as it is beneath the charge plate 620, but it can be seen that the discharge wire 624 runs in part as a trace along the upper surface. The probe tip is located at or near the center of the charge plate 620, and the transformer 626 is located at or near the perimeter of the charge plate 620.

Figure 7:
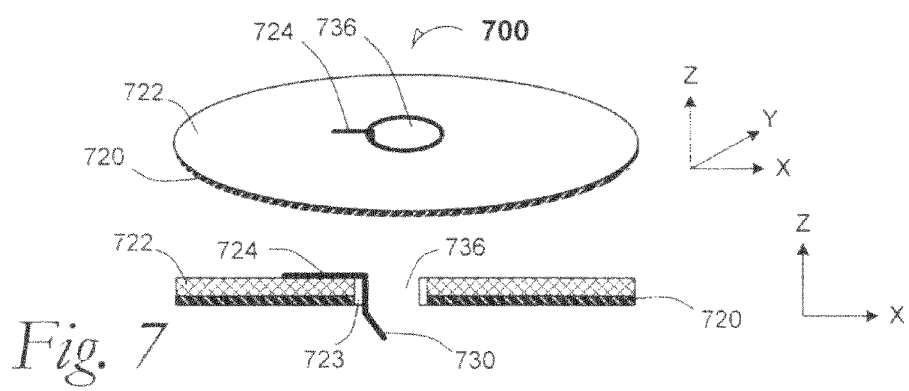
FIG. 7 is an exploded cross section and perspective of a wafer charged device model electrostatic discharge apparatus according to an example embodiment.

FIG. 7 is an exploded cross section and perspective of a wafer charged device model electrostatic discharge apparatus 700 according to an example embodiment. The charge plate 720 is a metal material. An insulating paddle 722 is a material such as a solder mask, and a discharge wire 724 runs along the top surface of the insulating paddle 722 and passes through a viewing hole 736 according to an embodiment. A probe tip 730 is an extension of the discharge wire 724.

In an embodiment, the probe tip 730 is a PTT-120, 12 micrometer (μm) radius tungsten needle that can be obtained from Cascade Microtech of Beaverton, Oreg. This size probe tip caused no significant pad erosion due to the CDM spark (e.g. 322 and 422 in FIGS. 3 and 4, respectively).

In an embodiment, a metal jig was used to assure consistent bending angles of the probe tip 730. With respect to the WCDM apparatus 500 and 600 set forth above, a 100 M Ω series resistor is used in place of the 1 M Ω resistor that is depicted in FIG. 2. This allows for improved correlation with the 300 M Ω resistor in the conventional ns-CDM apparatus.

Figure 8:
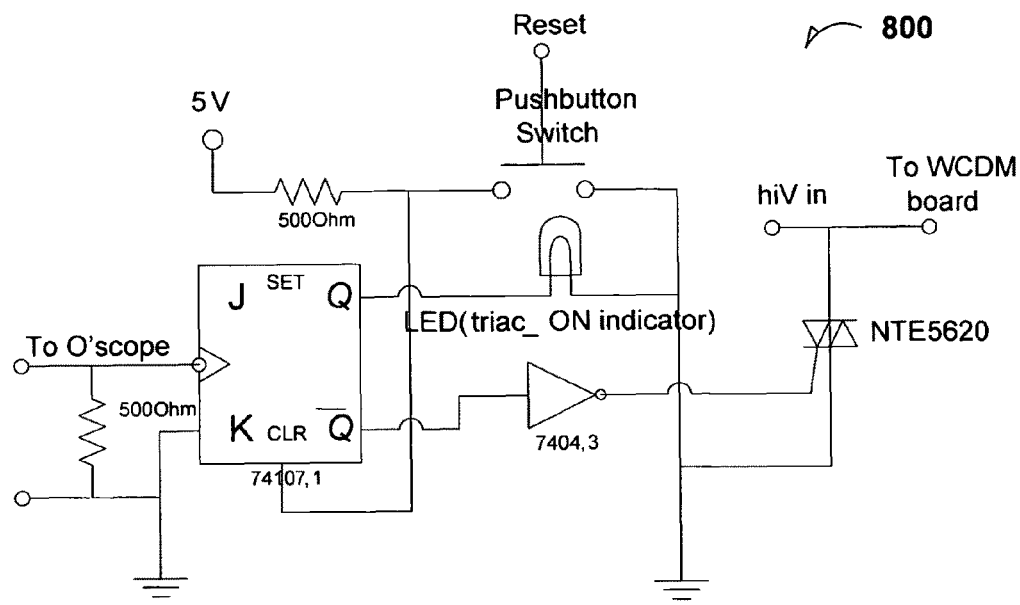
FIG. 8 is a schematic of effective circuitry for a charged device model electrostatic discharge apparatus according to an example embodiment.

FIG. 8 is a schematic of effective circuitry 800 for a charged device model electrostatic discharge apparatus according to an example embodiment. In an embodiment, recharge pulses and leakage current are reduced after a discharge by use of a triac 800 that shunts the voltage supply to ground at the time of discharge. The triac 800 (NTE5620, 800V, or CTA06, 1 kV) is triggered from the oscilloscope trigger-out as soon as the discharge is sensed. The control circuit is reset using a pushbutton switch. The control circuit was built separately in a portable box. In an embodiment, the total time required for the triac 800 to turn on was about 420 nanosecond (ns) after the on-wafer CDM event is triggered. After the probe is lifted, the circuit is reset with the pushbutton switch as illustrated according to an embodiment.

Figure 9:
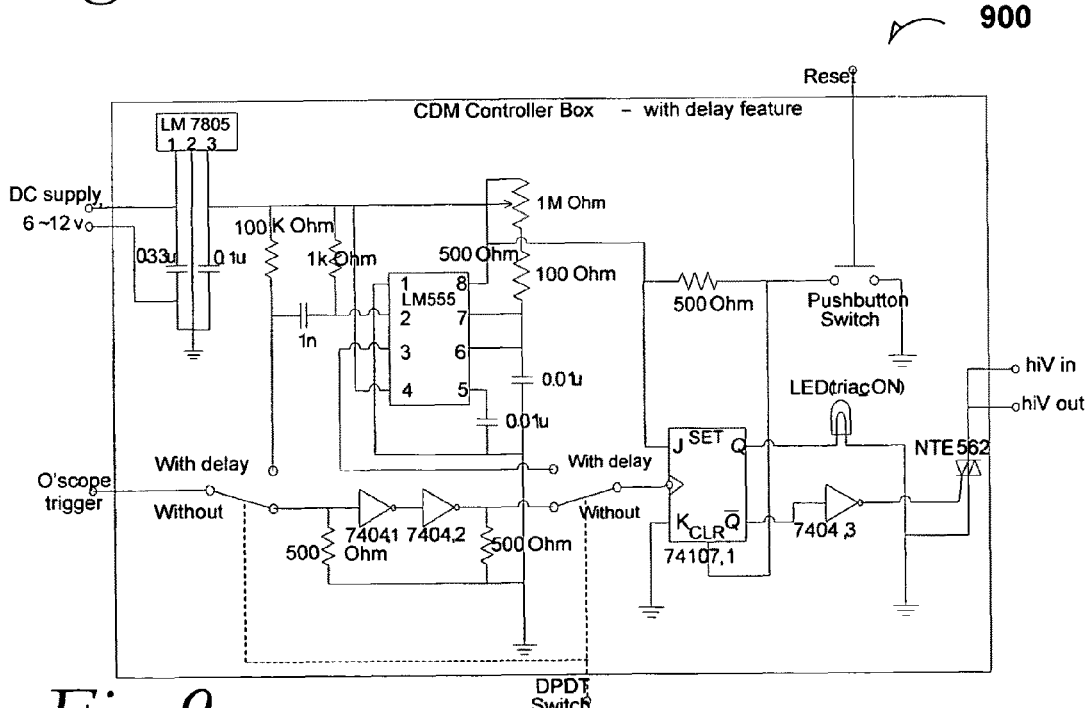
FIG. 9 is a schematic of effective circuitry for a charged device model electrostatic discharge apparatus according to an example embodiment.

FIG. 9 is a schematic of effective circuitry 900 for a charged device model electrostatic discharge apparatus according to an example embodiment. In an embodiment, recharge pulses and leakage current are reduced after a discharge by use of a triac 900 that grounds the voltage supply at the time of discharge. The triac 900 is an augmented embodiment of effective control circuitry ("effective circuitry") that implemented an LM555 timer that introduced an optional delay into clamping the triac 900 after the WCDM zapping. The triac 900 acts to simulate the presence or absence of a known residual charge effect in conventional packaged device CDM testing.

Figure 10:
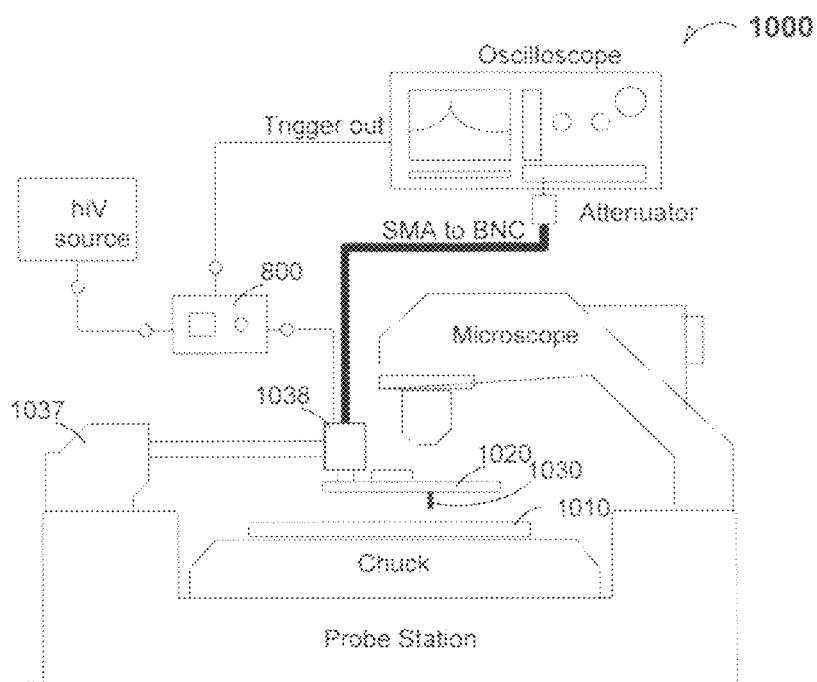
FIG. 10 is an elevational schematic of a wafer charged device model system according to an example embodiment.

FIG. 10 is an elevational schematic of a wafer charged device model system 1000 according to an example embodiment. In an embodiment, a mechanical linkage 1038 that is also referred to as a fixture 1038 ties the board to a positioner 1037. A WCDM apparatus charge plate 1020 is moved in x, y, and z directions to test an I/O pad on a wafer DUT 1010. In an embodiment the WCDM system 1000 allows for current-voltage (IV) curve tracing to ground by measuring from the charge plate node such as the charge plate node 540 depicted in FIG. 5. A micrograbber connects manually to switch between curve tracing and zapping. In tracing mode, the hiV node is positioned above the wafer 1010, and the micrograbber connects to a HP4156 semiconductor parameter analyzer (SPA). A triac such as the triac 800 is also coupled to the charge plate 1020.

Figure 11:
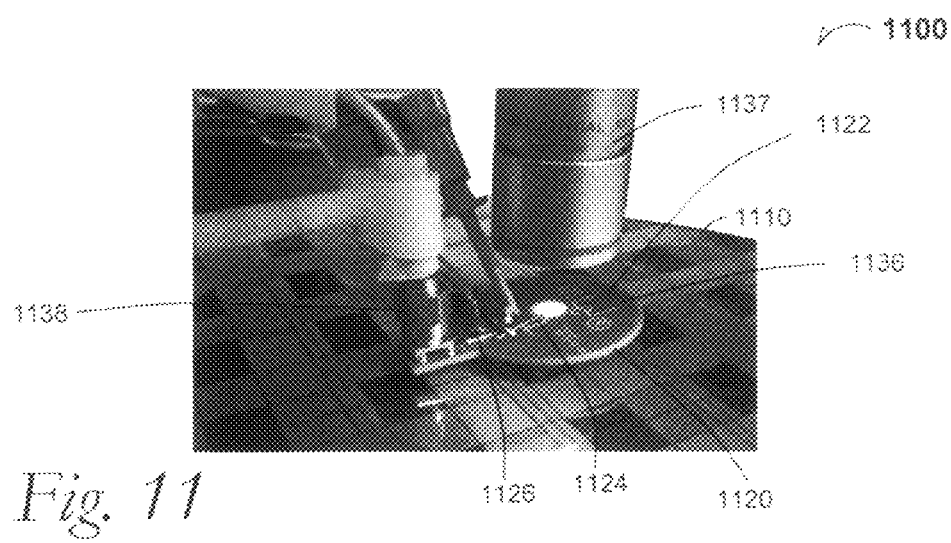
FIG. 11 is a computer regeneration of a photograph of a wafer charged device model system 1100 according to an example embodiment.

FIG. 11 is a computer regeneration of a photograph of a wafer charged device model system 1100 according to an example embodiment. In an embodiment, a mechanical linkage 1138 that is also referred to as a fixture 1138 holds WCDM apparatus charge plate 1120 above a wafer 1110. A discharge wire 1124 and a transformer 1126 are also depicted. A viewing hole 1136 is also depicted as well at a microscope 1137.

Figure 12:
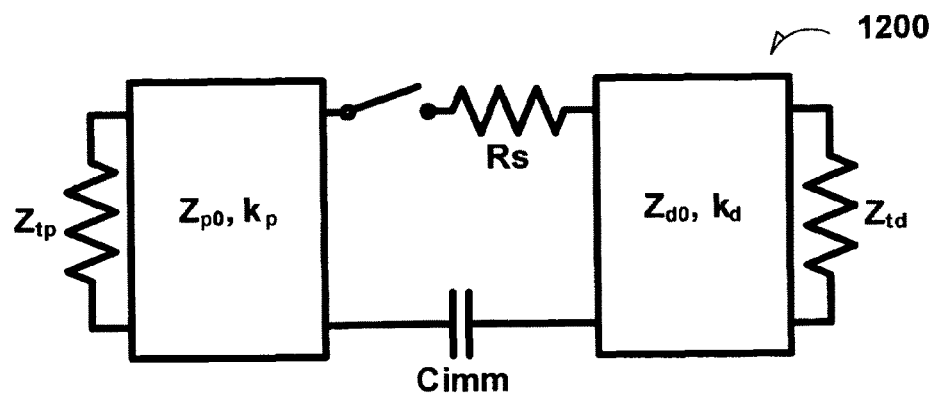
FIG. 12 represents a generalized transmission line model for a charged device model test system according to an embodiment.

FIG. 12 represents a generalized transmission line model for a charged device model test system 1200 according to an embodiment. The CDM test system 1200 is modeled by a loop as depicted with two transmission lines in series, terminated by low-Z in each case. In an embodiment, one line is for the device (impedance $Z_{d0}$, usually 50Ω, with propagation constant and electrical length given by $k_d$), and one line is for the test head and probe ($Z_{p0}$, $k_p$), with a presumed average test head impedance, of 100-200Ω depending on the test head. The terminations $Z_{td}$ and $Z_{tp}$ are generalized forms of Rd and Rp from FIG. 12, below.

The general expression for $Z_{din}$ is $$Z_{din}(s) = Z_{d0}\left[\frac{Z_{td} + Z_{d0}\tanh(k_d s)}{Z_{d0} + Z_{td}\tanh(k_d s)}\right], \quad (4)$$

and there is a corresponding expression for $Z_{pin}(s)$. The admittance function for the network becomes $$Y(s) = \frac{1}{R_s + Z_{din}(s) + Z_{pin}(s) + \dfrac{1}{C_{imm}s}}. \quad (5)$$

The zeros of this function (aside from the usual s=0 for series inductance-resistance-capacitance (LRC)) occur when one of the lines goes through a singularity such that tan(π/2), that is the quarter wave resonance on a line. The poles occur when the expression in the denominator goes to zero, and the lowest frequency poles are the outer loop of interest. Because s is a complex frequency, σ+jω, these lowest frequency poles could be real and negative (overdamped), as the negative s-dependent terms balance Rs. The higher-frequency poles of Y(s) will occur beyond the first quarter-wave resonance, when one $Z_{in}$ goes negative and (largely) imaginary, and eventually joins with the ever-smaller $C_{imm}$ term to balance the other $Z_{in}$. This will happen at the lowest frequency when both $Z_{in}$ functions approach quarter-wave near the same frequency; when one moves beyond π/2, goes negative j tan θ and soon zeros out the denominator.

Reducing the electrical length of one line pushes out this pole (or a conjugate pair of poles) to a higher frequency, but not above half-wavelength for the longer line. This higher frequency pole resonance can be destructive because the termination current (i.e., across the protection device) is raised by the high (equal and opposite) voltages appearing across both lines in series L-C resonance. It should be much more destructive than anything experienced by the termination at a zero of Y(s). For CDM testers, the electrical length ($k_p$) of the test head and probe pushes the half-wave resonance to lower frequency due to the combination of the test head and device.

Because the package trace effect is part of the intrinsic factory CDM event, the high-frequency stress is appropriate when those package conditions exist.

Equation 6 models a low-frequency LCR loop, for an embodiment of WCDM instruments and measurements. The admittance function is solved to give two poles, expressed in pole-zero form in the Laplace domain as $$Y(s) = \frac{s}{L(s+a)(s+b)}. \tag{6}$$

In general, the poles at −a and −b are complex frequencies, but given the nature of the WCDM waveforms focus is directed more on poles that are real and negative, i.e., overdamped. These poles are given by $$a, b = \frac{R}{2L}\left(1 \pm \sqrt{1 - \frac{4L}{R^2 C}}\right), \tag{7}$$

and focus is where R>2√(L/C). The sign convention is chosen so that the time domain solution will be a sum of exponentials $e^{-at}$ and $e^{-bt}$ according to Laplace transform analysis.

Figure 13:
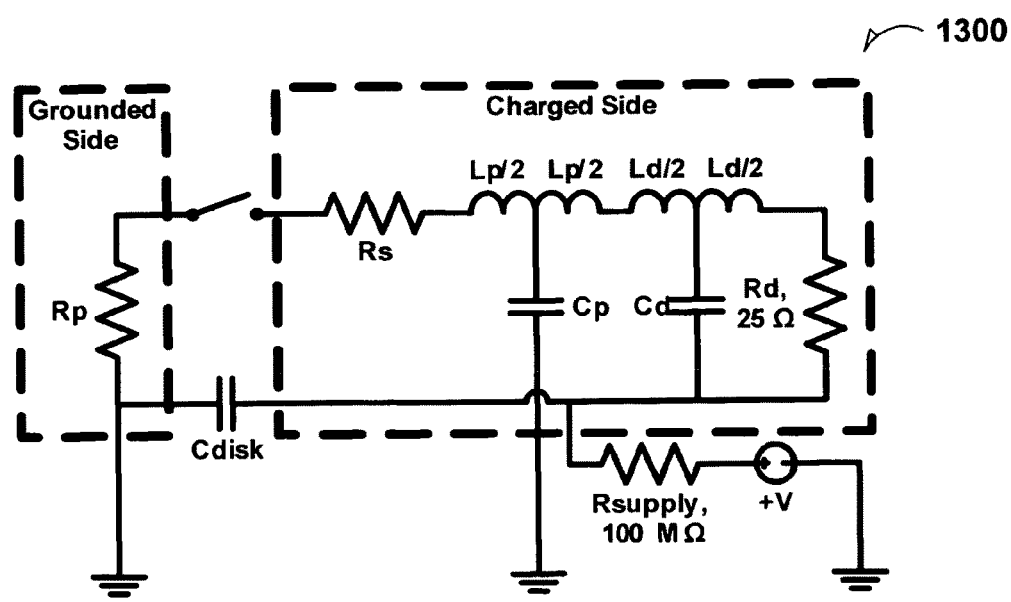
FIG. 13 is a representation of a wafer charge device model circuit according to an example embodiment.

FIG. 13 is a representation of a wafer charge device model circuit 1300 according to an example embodiment. For WCDM of FIG. 13 the focus is on the outer loop. Rp is approximately equal to zero to 1Ω on the wafer or the ground plate. The probe (Lp, Cp) is small and charged. The feed line to the transformer (Ld, Cd) is on top of the charge disk and it is electrically shielded. For the 4-5 pF disk (see FIG. 5), the probe Lp equaled 2.2 nH, the Cp equaled 0.06 pF, the Ld equaled 2.9 nH, and the Cd equaled 0.36 pF. The CDM discharge current in the Laplace domain can be represented as I(s)=V(s)*Y(s), where V(s) is a step function for the electrical discharge arc (e.g. 332 and 432), expressing the discharge of $C_{imm}$ or $C_{disk}$ to zero. The step function could be an infinitely abrupt step function $V_0$/s, but a finite rise time of the discharge arc itself is established irrespective of any LCR-related rise times. The rise time was estimated to be 50-200 picoseconds (10-90% rise time), which is captured as an additional pole so that the step function has a gradual exponential approach, $V_0(1-e^{-ct})$, where c is positive and real. For a 10-90% rise time τ, c is equal to 2.2/τ. The source becomes V(s)=$V_0$/(s(s+c)) (neglecting normalization factors) such that $$I(s) = \frac{V_0}{L(s+a)(s+b)(s+c)}. \tag{8}$$

This 3-pole model rendered LCR discharge current waveforms, as yet uninfluenced by the measurement system.

Figure 14:
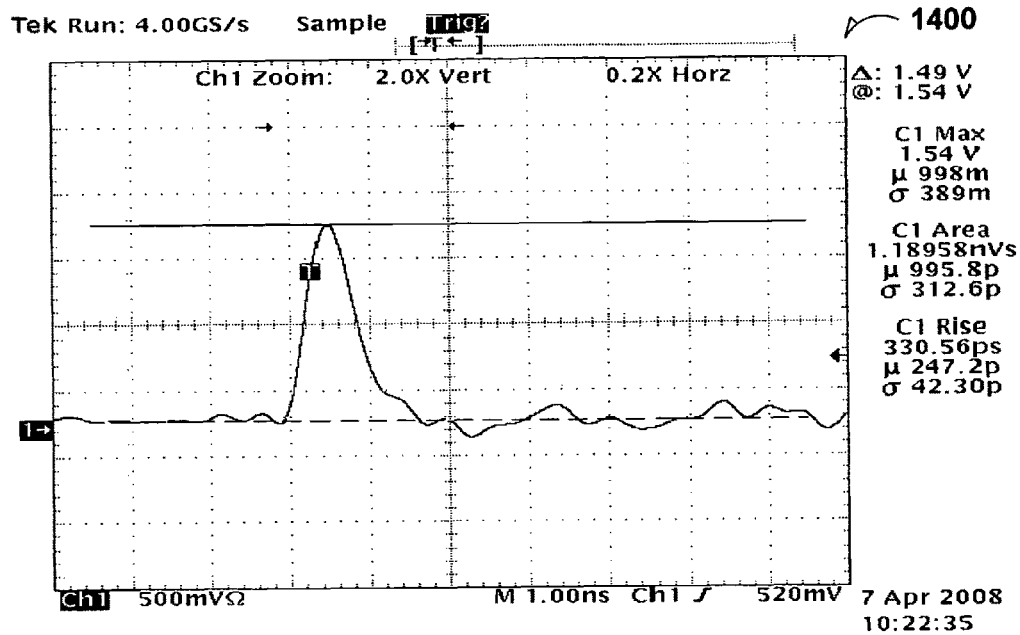
FIGS. 14 and 15 represent typical WCDM discharge pulses obtained from the WCDM setup for the small disk and the large disk, respectively according to example embodiments.
Figure 15:
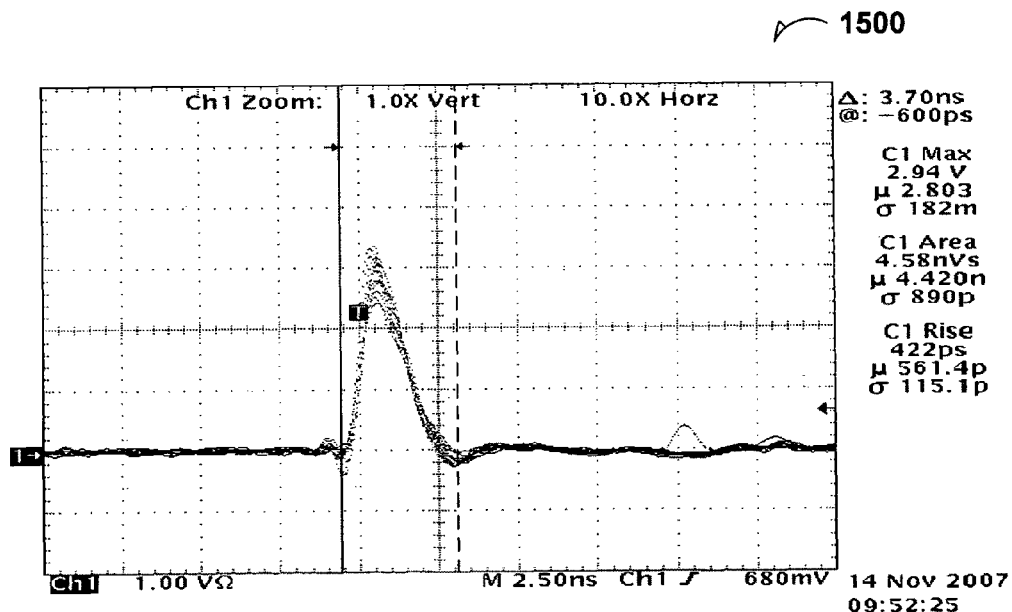

FIGS. 14 and 15 represent typical WCDM discharge pulses obtained from the WCDM setup for the small disk and the large disk, respectively according to example embodiments. These FIGs. are what was observed on the oscilloscope as read out from the transformer. The rise time, pulse width, overshoot, and undershoot of the waveform are comparable to both JEDEC and ESDA standards. FIG. 14 appears to be a typical WCDM waveform as read from the on-board SMT transformer. For the small disk (FIG. 5) a capacitance of 4.96 pF, 100V was observed. A Tek 784D scope (1 GHz) was used with a 10× attenuator and 50Ω. The peak current reading was 624 mA, and the charge was 496 pC.

FIG. 15 illustrates a sample of 10 repeated WCDM waveforms. For the large disk (FIG. 6) a capacitance of 18.5 pF and 100 V was observed. A Tek 784D scope (1 GHz), was used with a 10× attenuator and 50Ω. The average peak current reading was about 1.22 A and the charge was about 1.85 nC.

Figure 16:
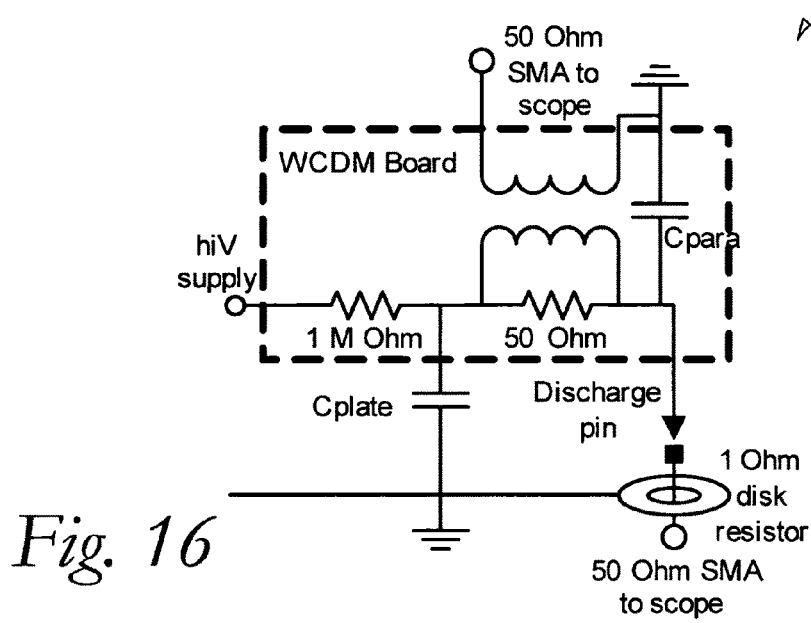
FIG. 16 is a representation of a wafer charge device model packet calibration setup according to an example embodiment.

FIG. 16 is a representation of a wafer charge device model packet calibration setup 1600 according to an example embodiment. One source of error with the scope waveform, particularly for the smaller disk, was the parasitic capacitance of the transformer. The setup is pictured as a single $C_{para}$ to ground, but capacitance across both sides of the transformer is similarly unmeasured by the scope, and the device experiences it in any event. This capacitance was extracted by measuring the pulse with a 1-Ω disk resistor target in place of the wafer, as illustrated in FIG. 16. By using the small board (FIG. 5) and the large board (FIG. 6), a wider range of repeatable charge packets can be generated as long as the Charge-to-Voltage (Q-V) relationship is linear.

The thin radius of the probe tip (e.g. probe tip 330) could limit the amount of charge the specific board can hold because of air ionization, but any such effect was outweighed by leakage of the 800V triac. The 1 kV triac allowed charging to 1 kV with little leakage of any kind.

Figure 17:
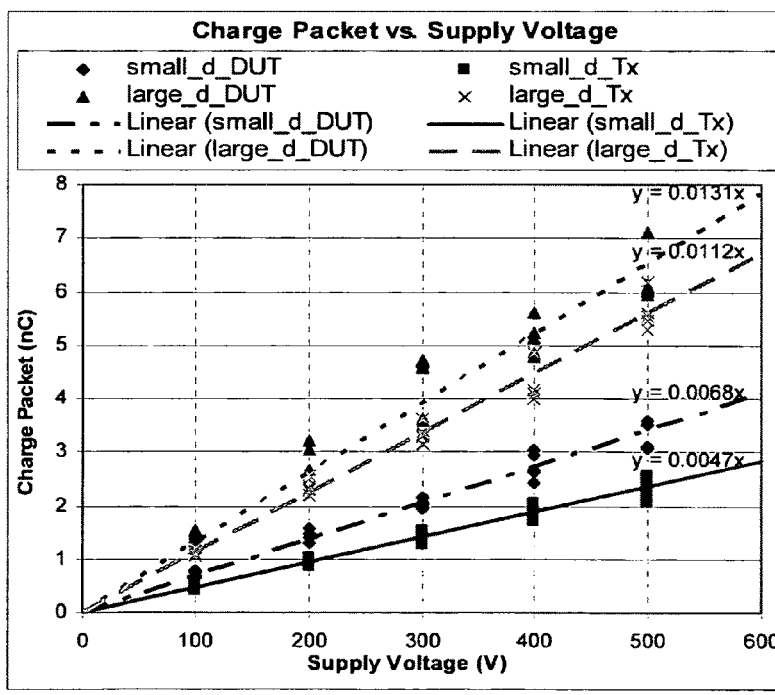
FIG. 17 shows a linear Q-V relationship up to 500 V for both boards according to example embodiments.

FIG. 17 shows a linear Q-V relationship up to 500 V for both boards according to example embodiments. The $C_{para}$ was about 2 pF across the transformer. FIG. 17 is a Q-V chart of the two WCDM board embodiments, taken through both the transformer and the 1-Ω resistor. The slope of each line is the equivalent capacitance in nF. It can be seen that the large disk (FIG. 6) carried a smaller charge than what is seen in FIG. 15 due to a longer probe tip, but in both disks $C_{para}$ was found to be about 2 pF.

Figure 18:
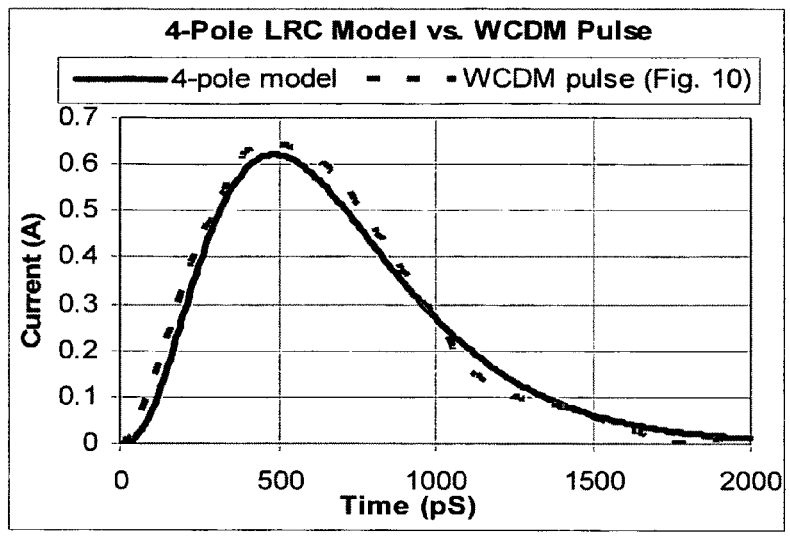
FIG. 18 is a time-domain, four-pole simulation of an inductance-resistance-capacitance (LRC) zap that was fit to the curve depicted in FIG. 14 for the small disk according to an example embodiment.

FIG. 18 is a time-domain, four-pole simulation of an inductance-resistance-capacitance (LRC) zap that was fit to the curve depicted in FIG. 14 for the small disk according to an example embodiment. In preparing the four-pole simulation, several things were observed. One observation was that readout of the waveform should be influenced by the bandwidth and rolloff of the 1 GHz, 4 GS/s, 400 pS rise time oscilloscope (Tek 784D), plus the insertion loss of the surface mount technology (SMT) transformer. The latter appeared to be about 3 dB/octave above about 900 MHz, and the scope indicated a rolloff frequency that was almost coincident with the transformer. Accordingly, measurement poles were put into the transfer function at 875 MHz (=d/2π, d positive and real). To capture both the scope and the transformer, the 6 dB/octave may be too little but 12 dB/octave, or two coincident poles, may capture both measurement and spark rise time effects, the latter of which are relatively minor in this measurement system. Finally, the transformer has baseline insertion loss of at least 4% at all frequencies, meaning that in calculating current and charge from voltage waveforms as in FIGS. 14 and 15, a factor dividing by 24 ohms instead of 25 was selected. These measured values, which include the in situ measured value of the capacitance each time, were included in the transfer function parameters.

As a consequence an estimate of current as measured $I_m(s)$ was, in the 4-pole model (without normalization factors) is represented in equation 9, $$I_m(s) = \frac{V_0}{L(s+a)(s+b)(s+c)(s+d)}. \tag{9}$$

The factor $I_m(s)$ was converted into the time domain as a sum of exponentials $e^{-at}$, $e^{-bt}$, $e^{-ct}$, $e^{-dt}$ with coefficients from Laplace transform tables, including the Heaviside Expansion Theorem. The factor was developed on an Excel® spreadsheet. These coefficients and the boundary conditions of the problem allow normalization. For $I_m(s)$ c and d are used both at 875 MHz, plus other expected values of all parameters. It was sought to match the measured data such as FIG. 14, and map back to plausible "real life" i.e. three-pole waveforms as in Eq. 8, by dropping out the c and d poles. This was done for the waveform depicted in FIG. 14.

FIG. 18 shows the 4-pole model for a 100V discharge as determined by the following parameters:
L=5.1 nH (estimated from probe (2.2 nH) and transformer feed line lengths and impedances)
C=4.96 pF (directly measured from FIG. 13)
R=69Ω (including 25Ω through the transformer and its termination; fairly insensitive to inductance)
875 MHz=f=ω/2π, ω=1/c=1/d measurement double pole, as above.

As a consequence of these parameters, FIG. 18 represents a time-domain four-pole simulation of an LRC zap that is fit to the waveform seen in FIG. 14, with two-pole measurement rolloff and LRC parameters set forth herein. Peak measured current from FIG. 14 of 624 mA, and 0-peak rise time of 520 pS and other rise time features were matched by the simulation. A resistance of R=69Ω implies 44Ω effective spark resistance. The 4-pole simulation seen in FIG. 18 converged well on a 44-Ω effective spark resistance Rs. It is believed Rs values very near this were reached over wide variations in modeled inductance, even with a 3-pole measurement model.

It is observed, however, that 44Ω exceeds the more common finding of an approximate 25Ω spark resistance for CDM testers, and perhaps because of more than the probe tip. In an embodiment, the WCDM point probe that was used was the same diameter as the CDM machine probe (about 0.5 mm) but the point probe that was used tapered to a 25 micron tip for pad probing. As a consequence a biconical transmission line was formed that is particularly easy to model.

It is observed that one feature of FIG. 18 that varies from the FIG. 14 waveform was the fall time, which rolls off more sharply in the scope measurement. It is believed this variation was due to the bandwidth of the parallel 50Ω resistance through the transformer and the scope substantially match. The series resistance in that part of the circuit started out with the 50Ω chip resistor and became 25Ω only as the transformer ramps up. This added a pole and a zero to the basic admittance function and caused a sharper fall time, with intercept of zero at 1.1-1.2 nsec, in agreement with what is observed in FIG. 14. Consequently, a 44Ω effective spark resistance was added to the final series resistance in the current path.

Figure 19:
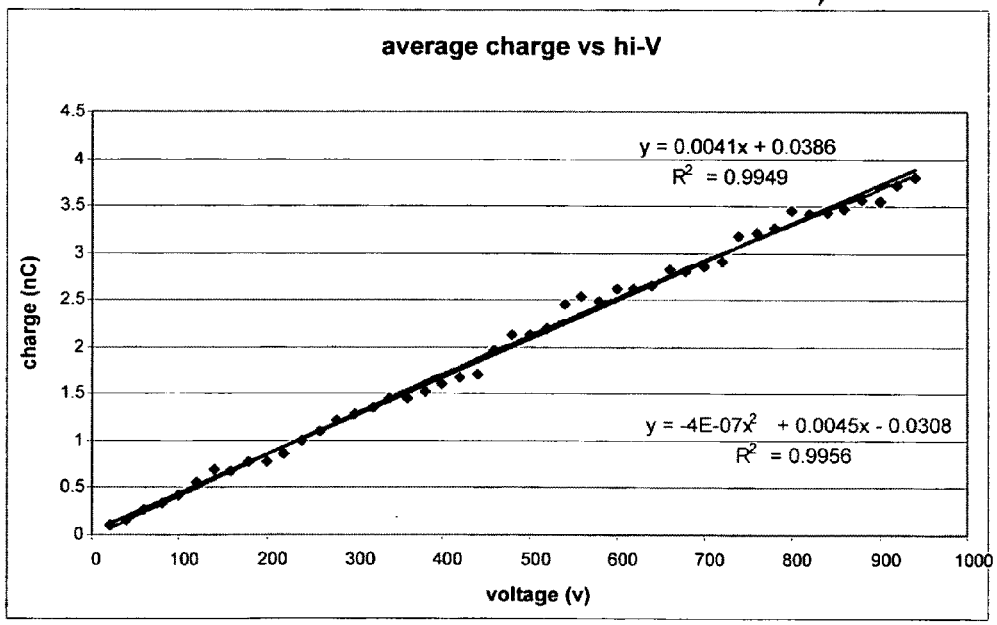
FIG. 19 is a graph of integrated charge under pulse as illustrated in FIG. 14 for the small disk versus charge plate for tested wafers according to an embodiment.

FIG. 19 is a graph of integrated charge under pulse as illustrated in FIG. 14 for the small disk (FIG. 5) versus charge plate 1900 for tested wafers according to an embodiment. A linear behavior was demonstrated to greater than 900 V and for about 4.1 pF capacitance. A similar curve was demonstrated for the large disk (FIG. 6)

Examples

A known CDM defect existed on a pair of test pattern pins in Intel's 45 nm process. These were tested using a ns-CDM tester on a packaged device, with the low failure voltages shown in Table 1. WCDM testing was done for both positive and negative test voltages for both of the pins, using the smaller WCDM board (FIG. 5). CDM failure voltage is compared with the corresponding WCDM charge packet in Table 1. Voltage polarity for WCDM is reversed, to agree with current direction for the equivalent ns-CDM event.

Table 1 shows a consistently lower failure charge for WCDM testing, and for both methods usually a lower failure level for negative voltage. We have adjusted WCDM data for the extra 2 pF of transformer capacitance not seen by the scope. The failure voltages are in the same range for both pins and polarities; if anything, WCDM appears to have such a sharp rise time and high peak current that passing several nC should assure excellent CDM performance in a package.

TABLE I

Weak pin pair CDM failure comparison

| Pad name | ns-CDM comparison | | WCDM embodiment | |
|---|---|---|---|---|
| | Voltage | Charge | Voltage | Charge |
| Pin A+ | 200 V | 2.92 nC | 200 V | 1.43 nC |
| Pin A− | −200 V | −3.08 nC | −100 V | −0.73 nC |
| Pin B+ | 600 V | 8.64 nC | 500 V | 3.57 nC |
| Pin B− | −200 V | −2.76 nC | −200 V | −1.39 nC |

In the following test case (Table II), another known failure on a test chip was tested using a socketed-CDM tester (KeyTek ZapMaster) and reproduced using the small-board WCDM (FIG. 5 at about 5 pF) to correlate.

TABLE II

ESD I/O pad CDM failure comparison

| Pad name | WCDM (kV) embodiment | S-CDM (kV) comparison |
|---|---|---|
| Pad 1 | −0.4 | −0.4 |
| Pad 2 | −0.5 | −0.5 |
| Pad 3 | Beyond −0.5 | −0.6 |
| Pad 4 | Beyond −0.5 | −0.9 |
| Pad 5 | Beyond −0.5 | −0.8 |
| Pad 6 | Beyond −0.5 | −0.5 |
| Pad 7 | −0.4 | −0.4 |
| Pad 8 | −0.4 | −0.3 |
| Pad 9 | −0.4 | −0.3 |
| Pad 10 | Beyond −0.5 | −0.6 |
| Pad 11 | Beyond −0.5 | −0.7 |
| Pad 12 | −0.5 | −0.4 |
| Pad 13 | −0.4 | −0.3 |

The comparison above showed a strong failure correlation between WCDM testing and S-CDM testing, with a correlation coefficient among comparable pads of 0.71. Without charge measurement of each S-CDM waveform, however, and without measuring for WCDM failure beyond −500V, WCDM is an in-depth is not presented. Also, S-CDM rise times and total charge quantities are known to be very different from ns-CDM testing, and now also from WCDM testing.

Figure 20:
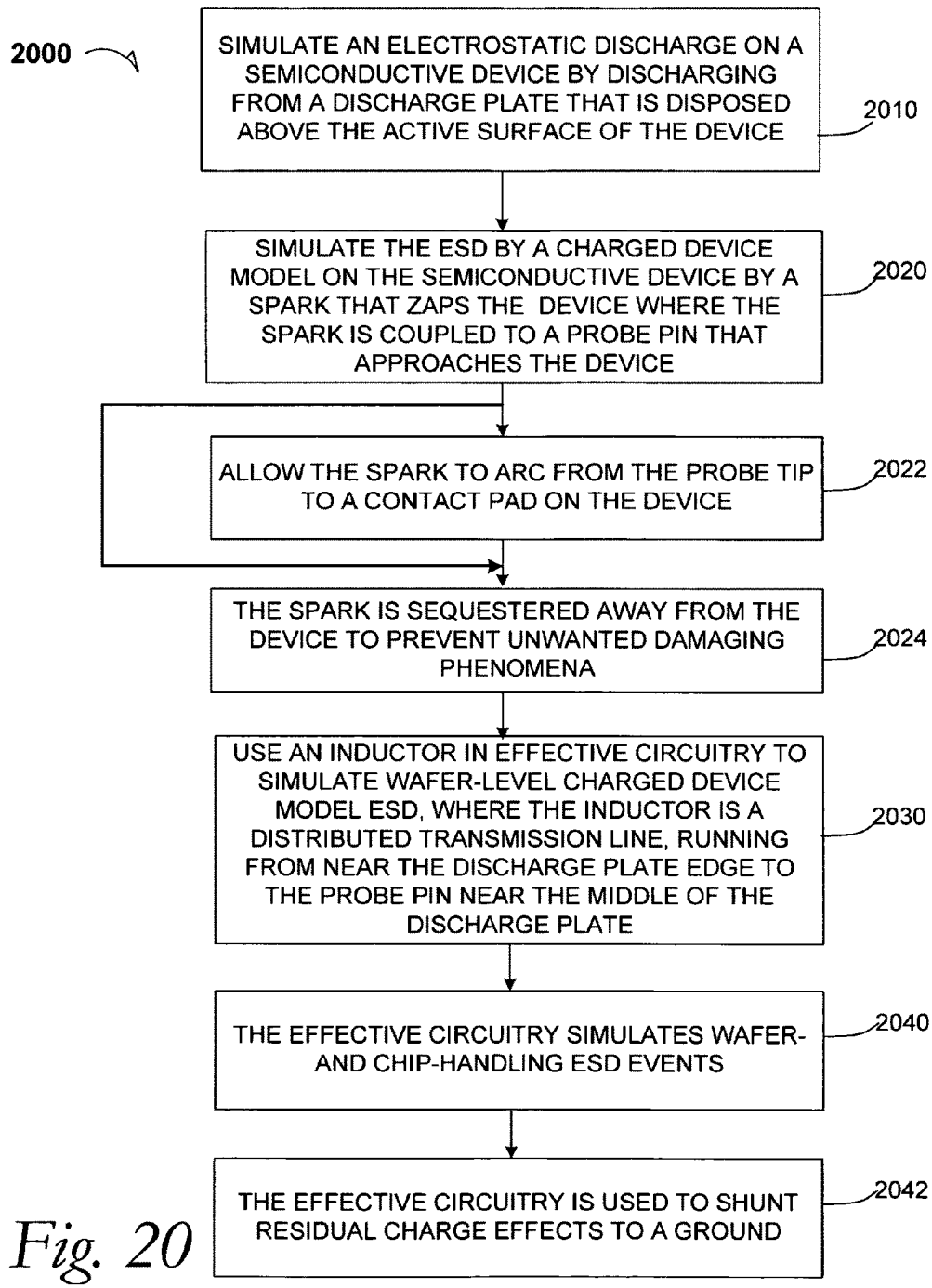
FIG. 20 is a method flow diagram according to an embodiment.

FIG. 20 is a method flow diagram 2000 according to an embodiment.

At 2010, the method includes simulating an electrostatic discharge (ESD) on a semiconductive device by discharging from a discharge plate that is disposed above the wafer active surface. Hereinafter, the semiconductive device may be referred to as a wafer, but it is understood that as semiconductive DUT may be a single die, two or more unsingulated dice, or an unsingulated wafer.

At 2020, the method includes simulating the ESD by a charged device model (CDM) on the wafer by allowing a spark (or discharge arc) to zap the wafer, where the spark is coupled to a probe tip that approaches the wafer.

At 2022, the method includes allowing the spark to jump across from the probe tip to the wafer at a contact pad of the wafer.

At 2024, the method includes allowing the spark to jump across a relay, where the probe tip touches the wafer at the contact pad, and the spark is sequestered away from the wafer to prevent unwanted damaging phenomena at the wafer.

At 2030, the method includes using a transformer and transmission line in effective circuitry to simulate the WCDM ESD, where the transmission line extends from the edge of the discharge plate to the center thereof, and where the probe tip is located closer to the center of the discharge plate than to the edge thereof. The transmission line largely becomes an inductor in the circuit, as in FIG. 13.

At 2040, the method includes using effective circuitry to simulate wafer and chip-handling ESD events.

At 2042, the effective circuitry is used to shunt residual charge effects to a ground.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus for charged device model (CDM) electrostatic discharge (ESD) testing, comprising:
   a charge plate to be disposed above a semiconductor wafer;
   an electrical probe disposed above the charge plate and passing from above the charge plate to below the charge plate;
   a mechanical link to position the charge plate and electrical probe above the semiconductor wafer;
   a transformer coupled to the electrical probe; and
   control circuitry coupled to the transformer, wherein the transformer and control circuitry facilitate in situ pulse measurement.

2. The apparatus of claim 1, further including a viewing hole disposed in the charge plate to accommodate microscopic viewing of the semiconductor wafer.

3. The apparatus of claim 1 further including a viewing hole disposed in the charge plate to accommodate microscopic viewing of the semiconductor wafer, and wherein the electrical probe passes through the viewing hole from above the charge plate to below the charge plate.

4. The apparatus of claim 1, wherein the control circuitry and transformer facilitate in situ pulse measurement by distinguishing an initial pulse generated at the electrical probe from a follow-on pulse.

5. The apparatus of claim 1, wherein the electrical probe includes a first length disposed above the charge plate, and a second length passing from above the charge plate to below the charge plate.

6. The apparatus of claim 1, wherein the charge plate has a center and an edge, wherein the electrical probe is located closer to the center that to the edge and wherein the transformer is located closer to the edge than to the center.

7. The apparatus of claim 1, wherein a spark is capable of arcing from the electrical probe to a semiconductive device that is placed facing the charge plate.

8. The apparatus of claim 1, wherein a spark is capable of arcing across a relay coupled to the electrical probe and wherein the spark is sequestered away from the semiconductive device.

9. The apparatus of claim 1 wherein the control circuitry shunts a residual charge effect to a ground.

\* \* \* \* \*